United States Patent
Han et al.

(10) Patent No.: US 12,004,393 B2
(45) Date of Patent: Jun. 4, 2024

(54) FOLDABLE DISPLAY DEVICE

(71) Applicant: LG Display Co., Ltd., Seoul (KR)

(72) Inventors: Yeseul Han, Gimpo-si (KR); MinJic Lee, Paju-si (KR); HongSik Kim, Goyang-si (KR); JeongOk Jo, Seoul (KR); Kwanghyun Choi, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 407 days.

(21) Appl. No.: 17/507,566

(22) Filed: Oct. 21, 2021

(65) Prior Publication Data

US 2022/0208931 A1 Jun. 30, 2022

(30) Foreign Application Priority Data

Dec. 31, 2020 (KR) .......................... 10-2020-0189701

(51) Int. Cl.
| | |
|---|---|
| *H10K 59/131* | (2023.01) |
| *G09F 9/30* | (2006.01) |
| *H10K 50/80* | (2023.01) |
| *H10K 77/10* | (2023.01) |
| *H10K 102/00* | (2023.01) |

(52) U.S. Cl.
CPC ........... *H10K 59/131* (2023.02); *G09F 9/301* (2013.01); *H10K 50/80* (2023.02); *H10K 77/111* (2023.02); *H10K 2102/311* (2023.02)

(58) Field of Classification Search
CPC .... H10K 59/131; H10K 50/80; H10K 77/111; H10K 2102/311; H10K 59/1213; H10K 59/1315; H10K 59/122; G09F 9/301; G06F 1/1652; G09G 3/3225; H01L 27/1218; H01L 27/124; H01L 27/1248
See application file for complete search history.

(56) References Cited

U.S. PATENT DOCUMENTS

| | | | |
|---|---|---|---|
| 10,121,977 B2 * | 11/2018 | Lee ..................... | H10K 59/1213 |
| 2020/0075707 A1 | 3/2020 | Ko et al. | |
| 2021/0296426 A1 * | 9/2021 | Saitoh ................ | H10K 59/1315 |

FOREIGN PATENT DOCUMENTS

| | | |
|---|---|---|
| KR | 10-2020-0000839 A | 1/2020 |
| KR | 10-2020-0027135 A | 3/2020 |

* cited by examiner

*Primary Examiner* — J. E. Schoenholtz
(74) *Attorney, Agent, or Firm* — Birch, Stewart, Kolasch & Birch, LLP

(57) ABSTRACT

A foldable display device includes a flexible display substrate having a folding area and non-folding areas on two sides of the folding area, and a plurality of scan lines disposed on the flexible substrate and extending in a specific direction. The scan lines disposed in the folding area include a first part and a second part which are disposed on different layers and which are formed of different materials.

9 Claims, 8 Drawing Sheets

FOLDABLE DISPLAY DEVICE

CROSS-REFERENCE TO RELATED APPLICATIONS

This application claims priority to Korean Patent Application No. 10-2020-0189701 filed on Dec. 31, 2020, in the Korean Intellectual Property Office, the entire contents of which are hereby expressly incorporated by reference into the present application.

BACKGROUND

Field

The present disclosure relates to a foldable display device, and more particularly to a foldable display device with improved durability and foldability.

Description of the Related Art

Recently, as the society enters a full-scale information era, a field of a display device which processes and displays a large amount of information has been rapidly developed. As display devices which are used for a monitor of a computer, a television, a cellular phone, or the like, there are an organic light emitting display device which is a self-emitting device, a liquid crystal display (LCD) device which uses a separate light source, and the like.

An applicable range of the display device is diversified to personal digital assistants as well as monitors of computers and televisions and a display device with a large display area and a reduced volume and weight is being studied.

Recently, a flexible display device which is manufactured to be capable of displaying images even though the flexible display device is bent or folded like papers is attracting attention as the next generation display device.

The flexible display device utilizes a plastic thin film transistor substrate rather than glass to be classified into an unbreakable display device having a high durability, a bendable display device which is bent without being broken, a rollable display device which is rolled, a foldable display device which is folded, and the like. Such a flexible display device has advantages in terms of space utilization, interior, and designs and has various application fields.

In the meantime, the flexible display device like the foldable display device includes a folding area which is folded along a specific radius of curvature with respect to a folding axis. However, when the folding area of the foldable display device is repeatedly folded, a wiring line disposed in the folding area may be cracked. Specifically, the wiring line which is formed of a material having a fracture strain which is lower than that of an inorganic layer, such as molybdenum (Mo), may be cracked or shorted, which can degrade the quality of the display panel.

SUMMARY OF THE DISCLOSURE

An object to be achieved by the present disclosure is to provide a foldable display device in which a durability and a foldability of a scan line or an emission control signal line disposed in the folding area are improved.

Another object to be achieved by the present disclosure is to provide a foldable display device which improves a display quality by a signal line which reduces a load applied to a wiring line and quickly transmits a signal.

Objects of the present disclosure are not limited to the above-mentioned objects, and other objects, which are not mentioned above, can be clearly understood by those skilled in the art from the following descriptions.

The present disclosure relates to a foldable display device and specifically, according to an aspect of the present disclosure, the foldable display device includes a flexible display substrate including a folding area and non-folding areas on two sides of the folding area; and a plurality of scan lines which are disposed on the flexible substrate and extends in a first direction. The scan lines disposed in the folding area include a first part and a second part which are disposed on different layers and which are formed of different materials.

Other detailed matters of the exemplary embodiments are included in the detailed description and the drawings.

According to the present disclosure, a scan line and/or an emission control signal line disposed in the folding area is configured by a first part and a second part which are disposed on different layers to improve a durability and a foldability of the wiring line.

According to the present disclosure, a crack or a short-circuit of the signal line in the folding area can be suppressed or minimized, and the durability and display quality of the display panel can be improved.

According to the present disclosure, a signal line is partially configured using a material having a low specific resistance to provide a foldable display device with an improved display performance.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
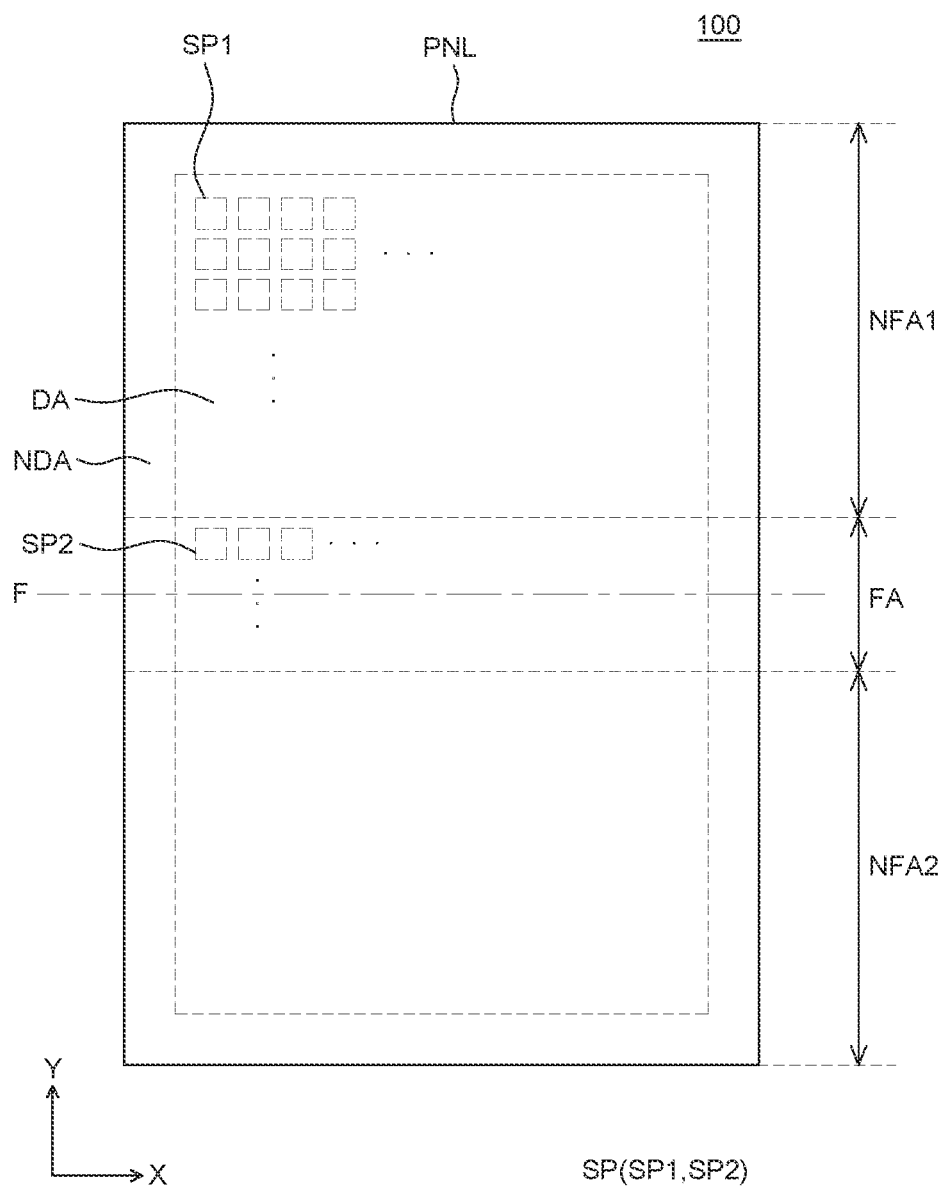
FIG. 1 is a schematic plan view of a foldable display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components, and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a foldable display device according to exemplary embodiments of the present disclosure will be described in detail with reference to accompanying drawings. All the components of each foldable display device according to all embodiments of the present disclosure are operatively coupled and configured.

FIG. 1 is a schematic plan view of a foldable display device according to an exemplary embodiment of the present disclosure.

Referring to FIG. 1, a foldable display device 100 according to an exemplary embodiment of the present disclosure includes a display panel PNL. Hereinafter, for the convenience of description, the foldable display device according to the exemplary embodiment of the present disclosure is assumed as an organic light emitting display device, but it is not limited thereto.

Referring to FIG. 1, the display panel PNL included in the foldable display device 100 includes a display area DA and a non-display area NDA. Further, the display panel PNL includes a folding area FA and non-folding areas NFA1 and NFA2. The display panel PNL can be divided into the display area DA and the non-display area NDA depending on whether to display images and can be divided into a folding area FA and non-folding areas NFA1 and NFA2 on both sides of the folding area depending on whether to be foldable. Here, the number of the non-folding areas can vary as desired.

The display area DA is an area where a plurality of pixels are disposed to substantially display images. In the display area DA, a plurality of pixels which include an emission area to display images, a thin film transistor for driving the pixels, a capacitor, and the like can be disposed. One pixel can include a plurality of sub pixels SP. The sub pixel SP is a minimum unit which configures the display area DA and each sub pixel SP can be configured to emit light of a specific wavelength band. For example, each of the sub pixels SP can be configured to emit red light, green light, blue light, or white light. Here, the plurality of sub pixels SP include first sub pixels SP1 disposed in the non-folding areas NFA1 and NFA2 and second sub pixels SP2 disposed in the folding area FA.

The non-display area NDA is located to enclose or surround the display area DA or a part thereof. The non-display area NDA is an area where images are not substantially displayed and various wiring lines, driving ICs, printed circuit boards, and the like for driving the pixels disposed in the display area DA and the driving circuits are disposed. For example, in the non-display area NDA, various driving ICs such as a gate driver IC and a data driver IC, VSS lines, and the like can be disposed.

As described above, the display panel PNL can be defined as a folding area FA and non-folding areas NFA1 and NFA2 depending on whether to be foldable. The display panel PNL according to the exemplary embodiment of the present disclosure includes a first non-folding area NFA1, a folding area FA, and a second non-folding area NFA2 which are sequentially located along a direction perpendicular to a folding axis F of the folding area FA, for example, a Y-axis direction.

The folding area FA is an area which is folded when the foldable display device 100 is folded and can include a part of the display area DA and a part of the non-display area NDA. The folding area FA can be folded along a direction perpendicular to the folding axis F of the folding area FA, for example, along a specific radius of curvature with respect to the Y axis direction of FIG. 1. When the folding area FA is folded with respect to a direction perpendicular to the folding axis F, the folding area FA can form a part of a circle or an oval. At this time, a radius of curvature of the folding area FA can refer to a radius corresponding to a part of a circle or an oval formed by the folding area FA.

The first non-folding area NFA1 and the second non-folding area NFA2 are not folded when the foldable display device 100 is folded. For example, the first non-folding area NFA1 and the second non-folding area NFA2 maintain a flat state when the foldable display device 100 is folded. The first non-folding area NFA1 and the second non-folding area NFA2 can include a part of the display area DA and a part of the non-display area NDA. When the folding area FA is folded with respect to the folding direction, the first non-folding area NFA1 and the second non-folding area NFA2 can overlap each other.

The display panel PNL is a panel in which images are implemented. Display elements for implementing images and circuit units for driving the display elements can be disposed in the display panel. For example, when the foldable display device 100 is an organic light emitting display device, the display element can include an organic light emitting diode.

The circuit units can include various thin film transistors, capacitors, wiring lines, driving ICs, and the like for driving the organic light emitting diode. For example, the circuit units can include various configurations such as a driving thin film transistor, a switching thin film transistor, a storage capacitor, a gate line, a data line, a gate driver IC, and a data driver IC, but are not limited thereto.

In the display panel PNL, a flexible substrate on which a driving thin film transistor and a light emitting diode are formed is encapsulated by an encapsulation unit so that in order to implement a flexibility, the display panel PNL includes a flexible substrate having a very thin thickness and a display element disposed on the flexible substrate.

A pixel circuit of the plurality of sub pixels SP of the display panel PNL will be described in more detail with reference to FIG. 2 together.

Figure 2:
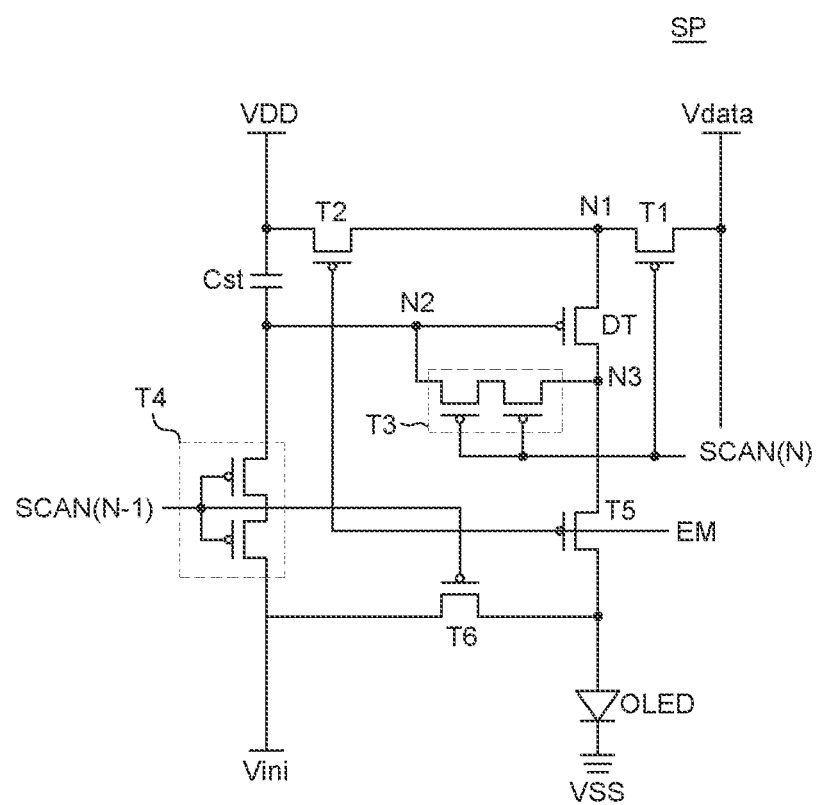
FIG. 2 is a circuit diagram of a pixel circuit of a foldable display device according to an exemplary embodiment of the present disclosure.

FIG. 2 is a circuit diagram of a pixel circuit of a foldable display device according to an exemplary embodiment of the present disclosure. As an example, each of at least one or more subpixels SP of the foldable display device of FIG. 1 can have the pixel circuit configuration of FIG. 2.

Referring to FIG. 2, in each of the plurality of sub pixels SP, a light emitting diode (OLED) and a pixel circuit for driving the light emitting diode (OLED) are disposed. The OLED can be an organic light emitting diode.

The pixel circuit can include a plurality of transistors and a storage capacitor Cst. For example, the pixel circuit can be formed with a 7T1C structure including a first transistor T1, a second transistor T2, a third transistor T3, a fourth transistor T4, a fifth transistor T5, a sixth transistor T6, a driving transistor DT, and one storage capacitor Cst. However, the number of transistors and capacitors included in the pixel circuit can vary, and it is not limited thereto.

In the meantime, the plurality of transistors can be an N-type transistor or a P-type transistor. In the N-type transistor, carriers are electrons so that electrons can flow from a source electrode to a drain electrode and currents can flow from the drain electrode to the source electrode. In the P-type transistor, carriers are holes so that holes can flow from a source electrode to a drain electrode and currents can flow from the source electrode to the drain electrode. For example, one of the plurality of transistors can be an N-type transistor and the other one of the plurality of transistors can be a P-type transistor. Hereinafter, it is assumed that the plurality of transistors is P-type transistors, but is not limited thereto.

The driving transistor DT is a transistor which controls a driving current applied to the light emitting diode OLED. In the driving transistor DT, a first electrode is connected to a first node N1, a gate electrode GE is connected to a second node N2, and a second electrode is connected to a third node N3. The first node N1 is a node to which a high potential power voltage VDD or a data voltage Vdata is transmitted and the driving transistor DT can be electrically connected to a high potential power line or a data line DL via the first node N1. The second node N2 is a node between the storage capacitor Cst and an initialization line and the driving transistor DT can be turned on or turned off based on a voltage transmitted to the second node N2. The third node N3 is a node between the driving transistor DT and the light emitting diode OLED and the driving current can pass through the third node N3 to be transmitted to an anode of the light emitting diode OLED.

The first transistor T1 selectively connects the data line DL and the first node N1 in accordance with a voltage applied to the gate electrode GE. The first transistor T1 has a gate electrode GE which is connected to an N-th scan line SL to be turned on or turned off by an N-th scan signal SCAN(N). When the first transistor T1 is turned on, the first node N1 and the data line DL can be electrically connected.

The second transistor T2 selectively connects the high potential power line and the first node N1 in accordance with a voltage applied to the gate electrode GE. The second transistor T2 has a gate electrode GE connected to an emission control line to be turned on or turned off by an emission control signal EM applied to the emission control line. When the second transistor T2 is turned on, the first node N1 and the high potential power line can be electrically connected.

The third transistor T3 is connected between the second node N2 and the third node N3. The third transistor T3 can be connected between the gate electrode GE of the driving transistor DT and the second electrode. The third transistor T3 has a gate electrode GE which is connected to an N-th scan line SL to be turned on or turned off by an N-th scan signal SCAN(N). The turned-on third transistor T3 shorts the gate electrode GE of the driving transistor DT and the second electrode to form a diode connection of the driving transistor DT.

If the driving transistor DT forms a diode connection by the third transistor T3, the current can flow from the first electrode of the driving transistor DT to the second electrode and the voltage of the second node N2 can be consistently increased. In this case, a voltage of the second node N2 connected to the gate electrode GE of the driving transistor DT rises by a value obtained by subtracting a threshold voltage of the driving transistor DT from a data voltage Vdata to sample the threshold voltage of the driving transistor DT. Accordingly, the third transistor T3 can allow a voltage obtained by compensating the threshold voltage of the driving transistor DT to the data voltage Vdata to be applied to the driving transistor DT.

The fourth transistor T4 is disposed between the initialization line and the second node N2. The fourth transistor T4 is turned on by an N−1-th scan signal SCAN(N−1) applied to an N−1-th scan line SL to electrically connect the initialization line and the second node N2. The fourth transistor T4 transmits an initialization voltage Vini to the gate electrode GE of the driving transistor DT which is the second node N2 to initialize the voltage of the gate electrode GE of the driving transistor DT to the initialization voltage Vini.

The fifth transistor T5 is disposed between the driving transistor DT and the light emitting diode OLED. The fifth transistor T5 is turned on by the emission control signal EM of the emission control line to transmit a driving current to the light emitting diode OLED. An emission timing of the light emitting diode OLED can be controlled by adjusting a turn-on timing of the fifth transistor T5.

The sixth transistor T6 is disposed between the anode of the light emitting diode OLED and the initialization line. The sixth transistor T6 is turned on by an N−1-th scan signal SCAN(N−1) applied to an N−1-th scan line SL to initialize a voltage of the anode of the light emitting diode OLED to the initialization voltage Vini. At this time, the sixth transistor T6 which initializes the voltage of the anode to the initialization voltage Vini can be referred to as an initialization transistor.

The storage capacitor Cst is disposed between the high potential power line and the second node N2. The storage capacitor Cst stores a predetermined voltage to constantly maintain a voltage of the gate electrode GE of the driving transistor DT during an emission period.

In the light emitting diode OLED, the anode is connected to the fifth transistor T5 and the cathode is connected to the low potential power line. The light emitting diode OLED can be supplied with the driving current controlled by the driving transistor DT to emit light.

In the meantime, the pixel circuit can be driven for one frame by dividing one frame into an initial period, a sampling and data writing period, and an emission period.

During the initial period, the voltage of the gate electrode GE of the driving transistor DT can be initialized.

First, during the initial period, a low level of N-1-th scan signal SCAN(N-1) can be applied to the N-1-th scan line SL. When the low level of N-1-th scan signal SCAN(N-1) is applied, the fourth transistor T4 and the sixth transistor T6 can be turned on.

The fourth transistor T4 is turned on to initialize the voltage of the gate electrode GE of the driving transistor DT to the initialization voltage Vini. The sixth transistor T6 is turned on so that the initialization voltage Vini is transmitted to the anode of the light emitting diode OLED to initialize the voltage of the anode to the initialization voltage Vini.

Next, during the sampling and data writing period, a low level of N-th scan signal SCAN(N) can be applied to the N-th scan line SL. In this case, the first transistor T1 and the third transistor T3 connected to the N-th scan line SL through the gate electrodes GE can be turned on.

The first transistor T1 is turned on to supply the data voltage Vdata to the first electrode of the driving transistor DT which is the first node N1. At this time, as described above, the third transistor T3 is turned on so that the voltage of the second node N2 rises by a value obtained by subtracting the threshold voltage of the driving transistor DT from the data voltage Vdata. Further, a voltage obtained by compensating the threshold voltage of the driving transistor DT to the data voltage Vdata can be applied to the gate electrode GE of the driving transistor DT.

Finally, during the emission period, a low level of emission control signal EM is applied to turn on the second transistor T2 and the fifth transistor T5. The second transistor T2 is turned on to supply the high potential power voltage VDD to the driving transistor DT and the fifth transistor T5 is turned on to transmit the driving current from the driving transistor DT to the light emitting diode OLED. Accordingly, during the emission period, the light emitting diode OLED can be supplied with the driving current to emit light.

Hereinafter, a first sub pixel SP1 disposed in the non-folding areas NFA1 and NFA2, among the plurality of sub pixels SP, will be described in more detail with reference to FIGS. 3 to 5 together.

Figure 3:
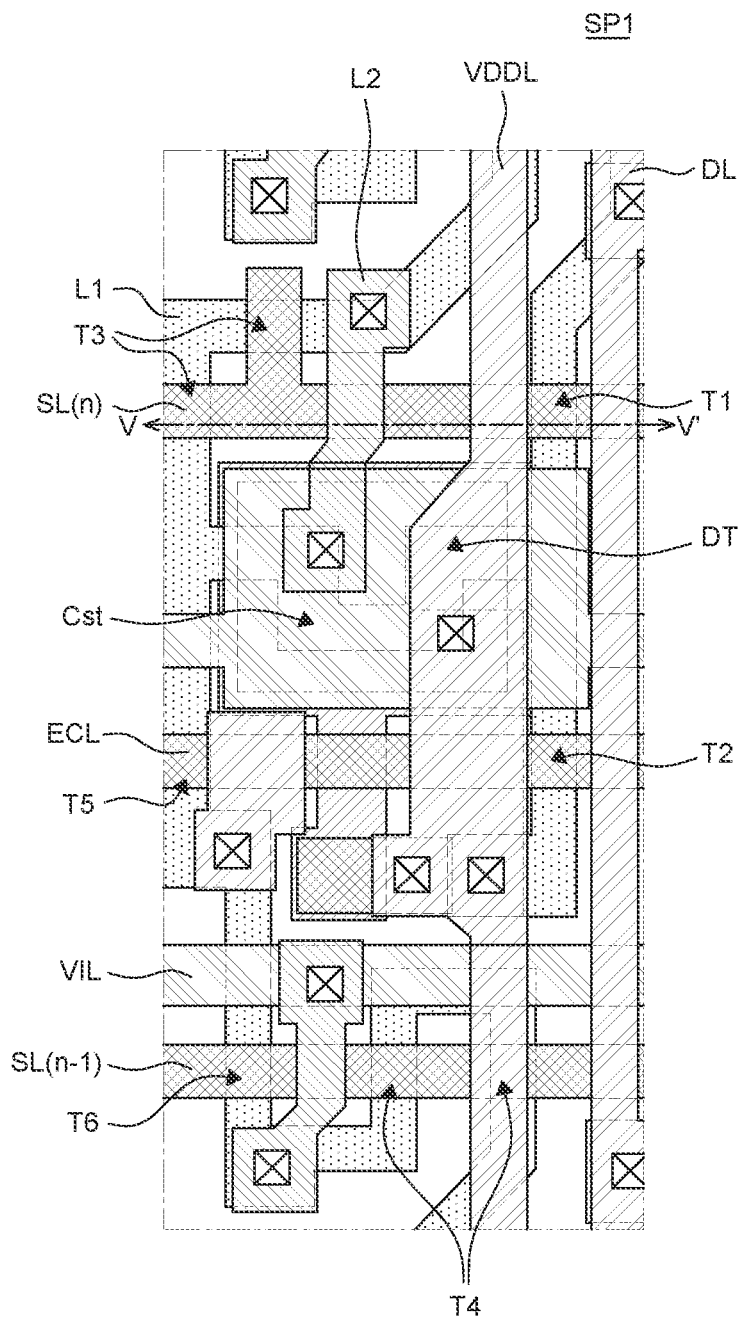
FIG. 3 is a schematic plan view of a first sub pixel of a foldable display device according to an exemplary embodiment of the present disclosure.

FIG. 3 is a schematic plan view of a first sub pixel of a foldable display device according to an exemplary embodiment of the present disclosure. FIG. 4 is a schematic cross-sectional view of a first sub pixel of a foldable display device according to an exemplary embodiment of the present disclosure. FIG. 5 is a cross-sectional view taken along the line V-V' of FIG. 3. In FIG. 4, for the convenience of description, a fifth transistor T5 and a light emitting diode of the first sub pixel are mainly illustrated on the cross-sectional view.

First, referring to FIG. 3, in the first sub pixel SP1, a first transistor T1, a second transistor T2, a third transistor T3, a fourth transistor T4, a fifth transistor T5, a sixth transistor T6, a driving transistor DT, and one storage capacitor Cst are disposed. Further, in the first sub pixel SP1, a high potential power line VDDL which transmits a high potential power voltage, a data line DL which transmits a data voltage, an n-th scan line SL(n) which transmits an n-th scan signal, an n-1-th scan line SL(n-1) which transmits an n-1-th scan signal, an emission control signal line ECL which transmits an emission control signal, and an initialization voltage line (VIL) which transmits an initialization voltage are disposed to pass therethrough. The first transistor T1, the second transistor T2, the third transistor T3, the fourth transistor T4, the fifth transistor T5, the sixth transistor T6, the driving transistor DT, and one storage capacitor Cst have been described in detail with reference to FIG. 2 so that a redundant description will be omitted or may be briefly provided. However, the placement of the first transistor T1, the second transistor T2, the third transistor T3, the fourth transistor T4, the fifth transistor T5, the sixth transistor T6, the driving transistor DT, and one storage capacitor Cst on plan view is not limited to the exemplary embodiment illustrated in FIG. 3 and can vary in various forms.

Figure 4:
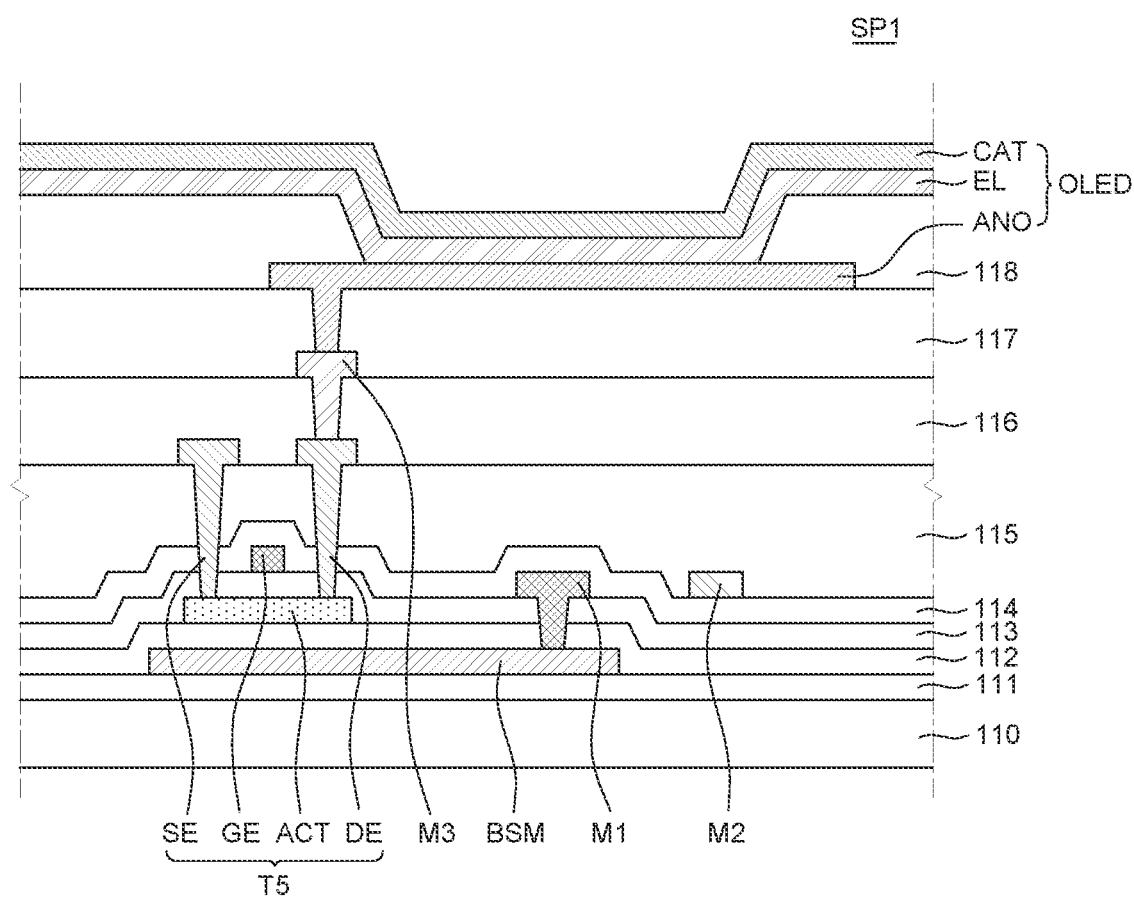
FIG. 4 is a schematic cross-sectional view of a first sub pixel of a foldable display device according to an exemplary embodiment of the present disclosure.

Referring to FIG. 4, the display device 100 includes a substrate 110, a first buffer layer 111, a second buffer layer 112, a gate insulating layer 113, a first interlayer insulating layer 114, a second interlayer insulating layer 115, a first planarization layer 116, a second planarization layer 117, a bank 118, a light emitting diode OLED, a fifth transistor T5, a light shielding layer BSM, a first conductive layer M1, a second conductive layer M2, and a third conductive layer M3.

Referring to FIG. 4, the substrate 110 is a support member for supporting other components of the foldable display device 100 and can be configured by an insulating material. For example, the substrate 110 can be formed of glass or resin. Further, the substrate 110 can be configured to include plastics such as polymer or polyimide PI or can be formed of a material having a flexibility.

The first buffer layer 111 is disposed on the substrate 110. The first buffer layer 111 can reduce permeation of moisture or impurities through the substrate 110. For example, the first buffer layer 111 can be configured by a single layer or a double layer of silicon oxide (SiOx) or silicon nitride SiNx, but is not limited thereto. However, the first buffer layer 111 can be omitted depending on a type of substrate 110 or a type of transistor, but is not limited thereto.

The light shielding layer BSM is disposed on the first buffer layer 111. The light shielding layer BSM is a layer which blocks external light which is incident onto an active layer ACT of the fifth transistor T5. The light shielding layer BSM can be formed of a metal, but is not limited thereto.

A voltage can be applied to the light shielding layer BSM. For example, a constant voltage can be applied to the light shielding layer BSM and an electrical floating state of the light shielding layer BSM is suppressed to suppress a parasitic capacitance generated between the light shielding layer BSM and the other components, but is not limited thereto. Alternatively, the same voltage as the gate electrode GE can be applied to the light shielding layer BSM. Therefore, the fifth transistor T5 can be implemented to have a dual gate structure having two gate electrodes GE, but is not limited thereto.

The second buffer layer 112 is disposed on the first buffer layer 111 and the light shielding layer BSM. The second buffer layer 112 can reduce the permeation of the moisture or impurities through the substrate 110 and insulate the light shielding layer BSM from the active layer ACT of the fifth transistor T5. For example, the second buffer layer 112 can be configured by a single layer or a double layer of silicon oxide SiOx or silicon nitride SiNx, but is not limited thereto.

The fifth transistor T5 is disposed on the second buffer layer 112. The fifth transistor T5 includes an active layer ACT, a gate electrode GE, a source electrode SE, and a drain electrode DE.

The active layer ACT can be formed of a semiconductor material such as an oxide semiconductor, amorphous silicon, or polysilicon, but is not limited thereto. For example, when the active layer ACT is formed of an oxide semiconductor, the active layer ACT is configured by a channel region, a source region, and a drain region and the source region and the drain region can be conductive regions, but are not limited thereto.

The gate insulating layer 113 is disposed on the active layer ACT. The gate insulating layer 113 is an insulating layer which insulates the active layer ACT from the gate electrode GE and can be configured by a single layer or a double layer of silicon oxide (SiOx) or silicon nitride (SiNx), but is not limited thereto.

The gate electrode GE is disposed on the gate insulating layer 113. The gate electrode GE can be configured by a conductive material such as copper (Cu), aluminum (Al), molybdenum (Mo), nickel (Ni), titanium (Ti), chrome (Cr), or an alloy thereof, but is not limited thereto. However, in accordance with a configuration of an a-th scan line and a b-th scan line to be described below, the gate electrode can be configured by molybdenum (Mo).

Further, the first conductive layer M1 can be disposed on the gate insulating layer 113. The first conductive layer M1 is a conductive layer which applies a voltage to the light shielding layer BSM. The first conductive layer M1 can be an electrode or a wiring line. The first conductive layer M1 can be formed of the same material as the gate electrode GE, but is not limited thereto.

The first interlayer insulating layer 114 is disposed on the gate electrode GE and the first conductive layer M1. In the first interlayer insulating layer 114, a contact hole through which the source electrode SE and the drain electrode DE are connected to the active layer ACT, respectively, is formed. The first interlayer insulating layer 114 can be configured by a single layer or a double layer of silicon oxide (SiOx) or silicon nitride (SiNx), but is not limited thereto.

The second conductive layer M2 is disposed on the first interlayer insulating layer 114. The second conductive layer M2 can be used as an intermediate layer in the pixel circuit. Here, the intermediate layer is a conductive layer which electrically connects two conductive layers, such as two different wiring lines, two different electrodes, or one wiring line and one electrode. Further, the second conductive layer M2 can also be used as one electrode of the storage capacitor. However, it is not limited thereto and the second conductive layer M2 can be used for various purposes in the pixel circuit.

The second interlayer insulating layer 115 is disposed on the first interlayer insulating layer 114 and the second conductive layer M2. In the second interlayer insulating layer 115, a contact hole through which the source electrode SE and the drain electrode DE are connected to the active layer ACT, respectively, is formed. The second interlayer insulating layer 115 can be configured by a single layer or a double layer of silicon oxide (SiOx) or silicon nitride (SiNx), but is not limited thereto.

The source electrode SE and the drain electrode DE are disposed on the second interlayer insulating layer 115. The source electrode SE and the drain electrode DE which are disposed to be spaced apart from each other can be electrically connected to the active layer ACT. The source electrode SE and the drain electrode DE can be configured by a conductive material, such as copper (Cu), aluminum (Al), molybdenum (Mo), nickel (Ni), titanium (Ti), chrome (Cr), or an alloy thereof, but are not limited thereto. However, the source electrode SE and the drain electrode DE can be configured by aluminum (Al), in accordance with a configuration of a b-th scan line to be described below.

The first planarization layer 116 is disposed on the second interlayer insulating layer 115. The first planarization layer 116 is an insulating layer which planarizes an upper portion of the substrate 110. The first planarization layer 116 can be formed of an organic material, and for example, can be configured by a single layer or a double layer of polyimide or photo acryl, but is not limited thereto.

The third conductive layer M3 is disposed on the first planarization layer 116. The third conductive layer M3 is an intermediate layer which connects the drain electrode DE of the fifth transistor T5 and the anode ANO of the light emitting diode OLED. The third conductive layer M3 can be configured by a conductive material such as copper (Cu), aluminum (Al), molybdenum (Mo), nickel (Ni), titanium (Ti), chrome (Cr), or an alloy thereof, but is not limited thereto. However, the third conductive layer M3 can be formed of the same material as the high potential power line VDDL and the data line DL.

The second planarization layer 117 is disposed on the third conductive layer M3. The second planarization layer 117 is an insulating layer which planarizes an upper portion of the substrate 110. The second planarization layer 117 can be formed of an organic material, and for example, can be configured by a single layer or a double layer of polyimide or photo acryl, but is not limited thereto.

The light emitting diode OLED is disposed on the second planarization layer 117. The light emitting diode OLED includes an anode ANO, an organic layer EL, and a cathode CAT.

The anode ANO is disposed on the second planarization layer 117. The anode ANO is electrically connected to a transistor of the pixel circuit, for example, the fifth transistor T5 to be supplied with a driving current. The anode ANO supplies holes to the organic layer EL so that the anode can be formed of a conductive material having a high work function. For example, the anode ANO can be formed of a transparent conductive material such as indium tin oxide (ITO) and indium zinc oxide (IZO), but is not limited thereto.

In the meantime, the foldable display device 100 can be implemented by a top emission type or a bottom emission type. When the display device is a top emission type, a reflective layer which is formed of a metal material having an excellent reflection efficiency, such as aluminum (Al) or silver (Ag), can be added below the anode ANO. Therefore, light emitted from the organic layer EL is reflected from the anode ANO to be directed to the upper direction, for example, the cathode CAT. In contrast, when the foldable display device 100 is a bottom emission type, the anode ANO can be only formed of a transparent conductive material. Hereinafter, the description will be made under the assumption that the foldable display device 100 according to the exemplary embodiment of the present disclosure is a top emission type.

A bank 118 is disposed on the anode ANO and the second planarization layer 117. The bank 118 is an insulating layer disposed between the plurality of sub pixels SP to divide the plurality of sub pixels SP. The bank 118 includes an opening which exposes a part of the anode ANO. The bank 118 can be an organic insulating material disposed to cover an edge or a border of the anode ANO. For example, the bank 118 can be formed of a polyimide resin, an acrylic resin, or a benzocyclobutene (BCB) resin, but is not limited thereto.

The organic layer EL is disposed on the anode ANO and the bank 118. The organic layer EL can include a light emitting layer and a common layer. The light emitting layer is an organic layer EL which emits light having a specific color and a different light emitting layer can be disposed for every sub pixel in accordance with a color of light emitted by the plurality of sub pixels. However, it is not limited thereto and a light emitting layer is commonly disposed in all the plurality of sub pixels SP and light from the light emitting layer can be converted into light having various colors by means of a photo-conversion layer, a color filter, and the like.

The common layer is an organic layer EL which is disposed to improve a luminous efficiency of the light emitting layer. The common layer can be formed as one layer over the plurality of sub pixels SP. For example, the common layers of the plurality of sub pixels SP are connected to be integrally formed. The common layer can include a charge generation layer, a hole injection layer, a hole transport layer, an electron transport layer, an electron injection layer, or the like, but is not limited thereto.

The cathode CAT is disposed on the organic layer EL. The cathode CAT supplies electrons to the organic layer EL so that the cathode can be formed of a conductive material having a low work function. The cathode CAT can be formed as one layer over the plurality of sub pixels SP. For example, the cathodes CAT of the plurality of sub pixels SP are connected to be integrally formed. For example, the cathode CAT can be formed of a transparent conductive material such as indium tin oxide (ITO) and indium zinc oxide (IZO), or a metal alloy such as MgAg or an ytterbium (Yb) alloy and can further include a metal doping layer, but is not limited thereto. In the meantime, the cathode CAT is electrically connected to the low potential power line to be supplied with a low potential power voltage VSS.

Figure 5:
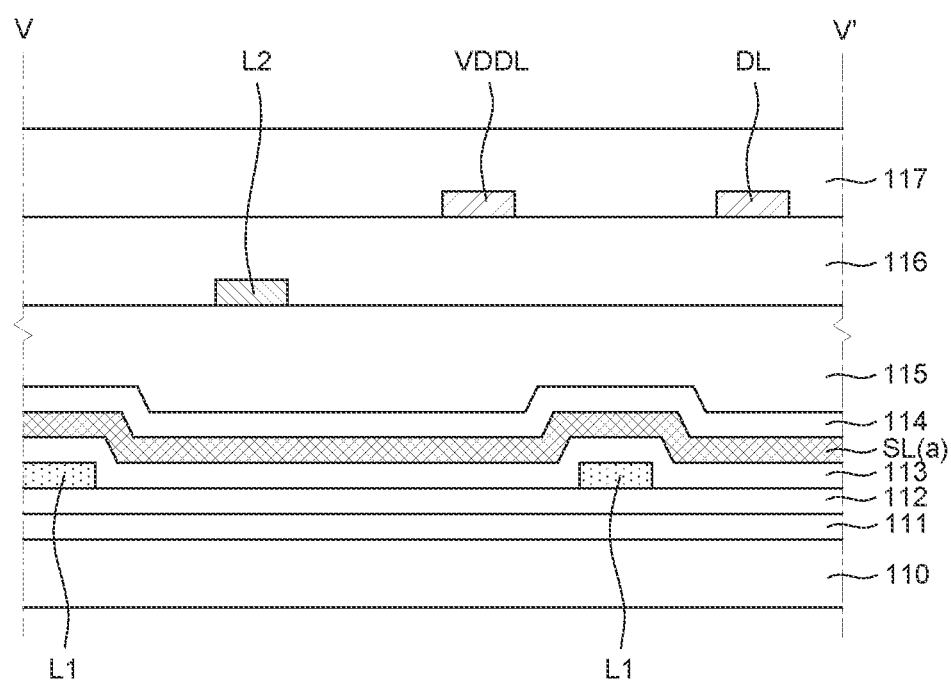
FIG. 5 is a cross-sectional view taken along the line V-V' of FIG. 3.

FIG. 5 illustrates a cross-section of an area where the n-th scan line SL(n) extending in a horizontal direction on the plan view of the pixel circuit illustrated in FIG. 3 is disposed. In FIG. 3, for the purpose of general description, the n-th scan line SL(n) and the n−1-th scan line SL(n−1) are illustrated. However, in FIG. 5, for the purpose of explanation of a specific first sub pixel SP1, for example, the first sub pixel SP1 located on an a-th line, the n-th scan line SL(n) is denoted by an a-th scan line.

Referring to FIG. 5, the first buffer layer 111 is disposed on the substrate 110 and the second buffer layer 112 is disposed on the first buffer layer 111.

The first wiring line L1 is disposed on the second buffer layer 112. The first wiring line L1 can be formed of the same material as the active layer ACT. Further, the first wiring line L1 can be connected to the active layer ACT. However, a current may not flow in the first wiring line L1 except for an area functioning as an active layer.

The gate insulating layer 113 is disposed on the first wiring line L1.

The a-th scan line SL(a) is disposed on the gate insulating layer 113. The a-th scan line SL(a) can be formed of the same material as the gate electrode GE. Specifically, the a-th scan line SL(a) can be formed to be integral with the gate electrode GE of the third transistor T3. The a-th scan line SL(a) can be formed as a single layer in the entire display panel PNL. However, the a-th scan line SL(a) can be configured by molybdenum (Mo) in accordance with the configuration of the b-th scan line SL(b) to be described below.

The first interlayer insulating layer 114 is disposed on the a-th scan line SL(a) and the second interlayer insulating layer 115 is disposed on the first interlayer insulating layer 114.

The second wiring line L2 is disposed on the second interlayer insulating layer 115. The second wiring line L2 can serve as a connection line. For example, the second wiring line can serve as a wiring line to connect two conductive layers which need to be connected. For example, referring to FIG. 3, the second wiring line L2 can connect the first wiring line L1 and the second conductive layer M2. For example, the second wiring line L2 can connect the source electrode SE of the third transistor T3 and one electrode of the storage capacitor Cst. However, the function of the second wiring line L2 is not limited thereto. Further, the second wiring line L2 can be configured by a conductive material such as copper (Cu), aluminum (Al), molybdenum (Mo), nickel (Ni), titanium (Ti), chrome (Cr), or an alloy thereof, but is not limited thereto. However, the second wiring line L2 can be configured by aluminum (Al) in accordance with the configuration of the b-th scan line SL(b) to be described below.

The first planarization layer 116 is disposed on the second wiring line L2. The high potential power line VDDL and the data line DL are disposed on the first planarization layer 116. The second planarization layer 117 is disposed on the high potential power line VDDL and the data line DL.

In FIGS. 4 and 5, an emission control signal line ECL is disposed on the gate insulating layer 113. The emission control signal line ECL can be formed of the same material as the gate electrode GE and the a-th scan line SL(a).

In FIGS. 4 and 5, an initialization voltage line VIL is disposed on the second interlayer insulating layer 115. The initialization voltage line VIL can be formed of the same material as the source electrode SE and the drain electrode DE.

Hereinafter, a second sub pixel SP2 disposed in the folding area FA, among the plurality of sub pixels SP, will be described in more detail with reference to FIGS. 6 to 8 together.

Figure 6:
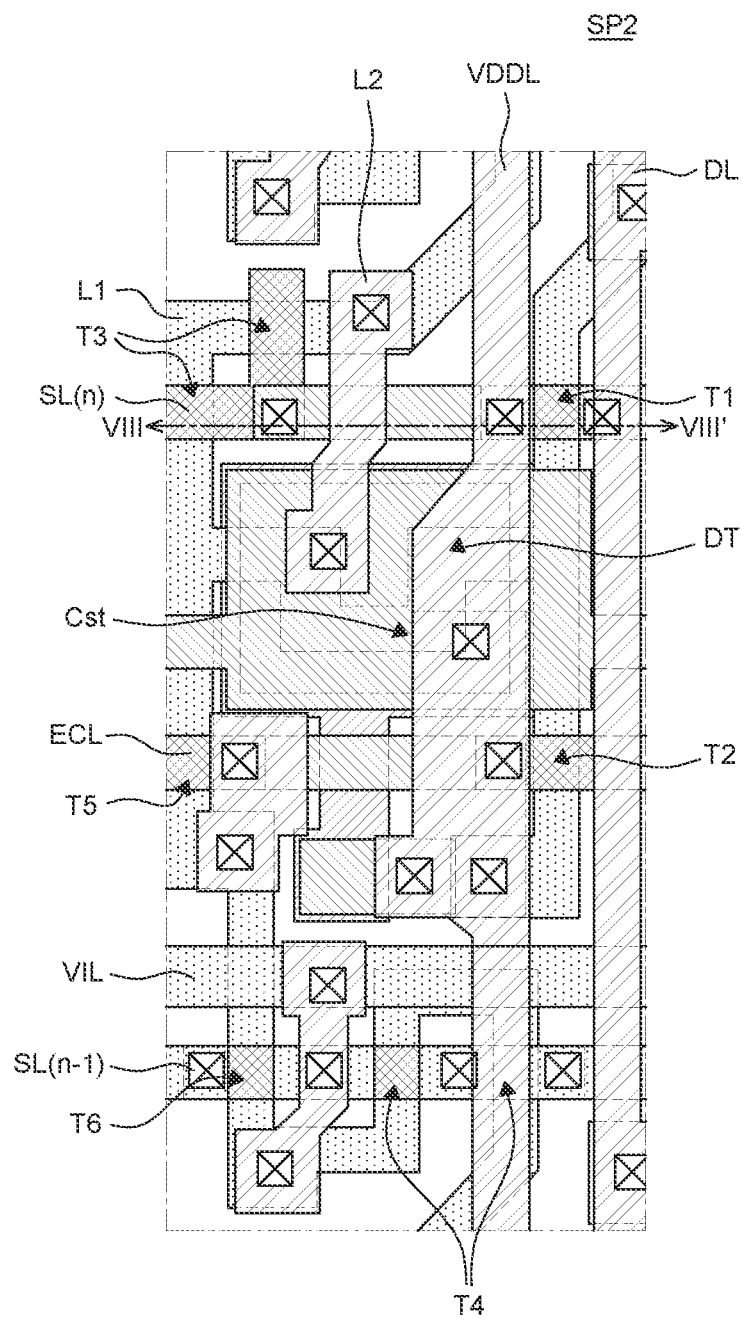
FIG. 6 is a schematic plan view of a second sub pixel of a foldable display device according to an exemplary embodiment of the present disclosure.

FIG. 6 is a schematic plan view of a second sub pixel of a foldable display device according to an exemplary embodiment of the present disclosure. FIG. 7 is a schematic cross-sectional view of a foldable display device according to an exemplary embodiment of the present disclosure. FIG. 8 is a cross-sectional view taken along the line VIII-VIII' of FIG. 6. In FIG. 7, for the convenience of description, a fifth transistor T5 and a light emitting diode OLED of the second sub pixel SP2 are mainly schematically illustrated on the cross-sectional view.

First, referring to FIG. 6, in the second sub pixel SP2, a first transistor T1, a second transistor T2, a third transistor T3, a fourth transistor T4, a fifth transistor T5, a sixth transistor T6, a driving transistor DT, and one storage capacitor Cst are disposed. Further, in the second sub pixel SP2, a high potential power line VDDL which transmits a high potential power voltage, a data line DL which transmits a data voltage, an n-th scan line SL(n) which transmits an n-th scan signal, an n−1-th scan line SL(n−1) which transmits an n−1-th scan signal, an emission control signal line ECL which transmits an emission control signal, and an initialization voltage line (VIL) which transmits an initialization voltage are disposed to pass therethrough. The first transistor T1, the second transistor T2, the third transistor T3, the fourth transistor T4, the fifth transistor T5, the sixth transistor T6, the driving transistor DT, and one storage capacitor Cst have been described in detail with reference to FIG. 2 so that a redundant description will be omitted or may be briefly provided. However, the placement of the first transistor T1, the second transistor T2, the third transistor T3, the fourth transistor T4, the fifth transistor T5, the sixth transistor T6, the driving transistor DT, and one storage capacitor Cst on plan view is not limited to the exemplary embodiment illustrated in FIG. 6 and can vary in various forms.

Figure 7:
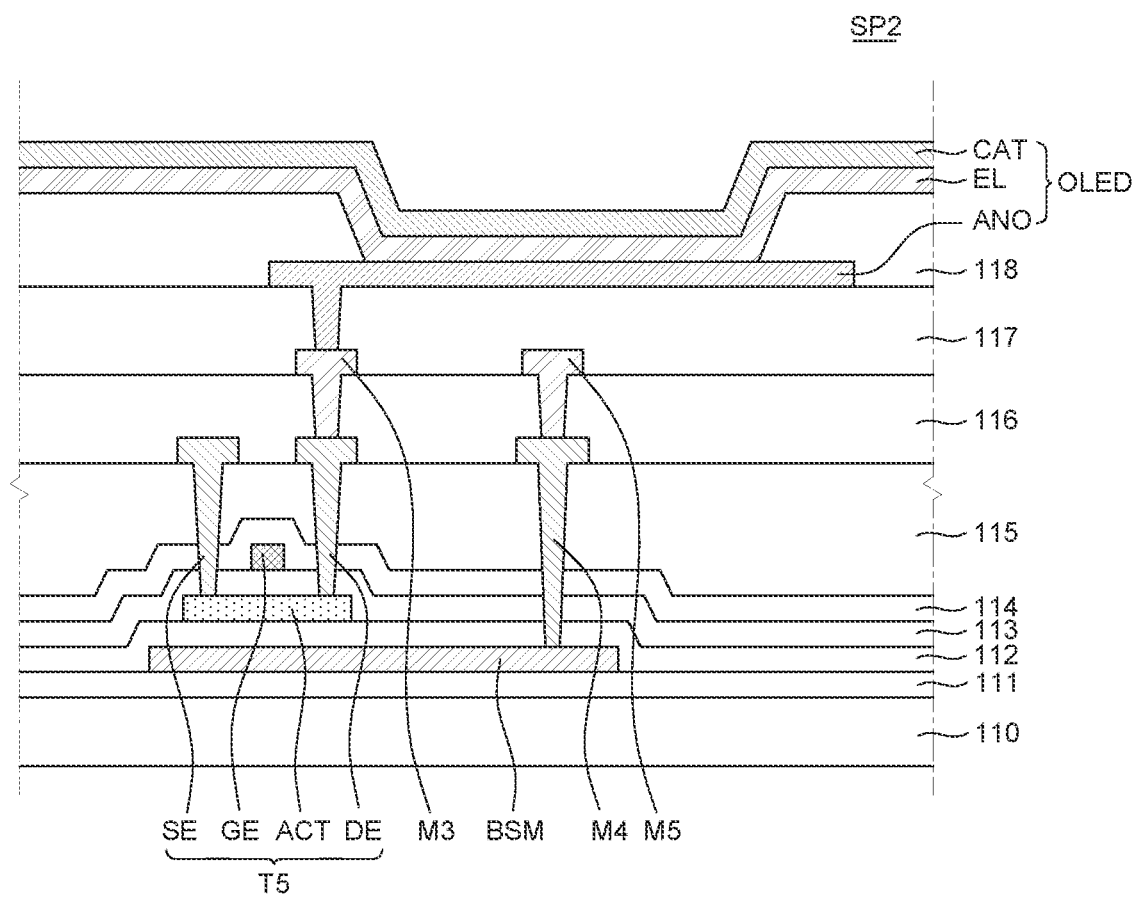
FIG. 7 is a schematic cross-sectional view of a foldable display device according to an exemplary embodiment of the present disclosure.

Referring to FIG. 7, the display device 100 includes a substrate 110, a first buffer layer 111, a second buffer layer 112, a gate insulating layer 113, a first interlayer insulating layer 114, a second interlayer insulating layer 115, a first planarization layer 116, a second planarization layer 117, a bank 118, a light emitting diode OLED, a fifth transistor T5, a light shielding layer BSM, a third conductive layer M3, a fourth conductive layer M4, and a fifth conductive layer M5. As compared with the cross-sectional structure of the first sub pixel SP1 illustrated in FIG. 4, the cross-sectional structure of the second sub pixel SP2 illustrated in FIG. 7 is substantially the same except that the first conductive layer M1 and the second conductive layer M2 are omitted and the fourth conductive layer M4 and the fifth conductive layer M5 are added. Therefore, a redundant description will be omitted or may be briefly provided.

The fourth conductive layer M4 is disposed on the second interlayer insulating layer 115. The fourth conductive layer M4 is a conductive layer which applies a voltage to the light shielding layer BSM. The fourth conductive layer M4 can be an electrode or a wiring line. The fourth conductive layer M4 can be formed of the same material as the source electrode SE and the drain electrode DE, but is not limited thereto. The fourth conductive layer M4 can be configured by a conductive material such as copper (Cu), aluminum (Al), molybdenum (Mo), nickel (Ni), titanium (Ti), chrome (Cr), or an alloy thereof, but is not limited thereto. However, the fourth conductive layer M4 can be configured by aluminum (Al) in accordance with the configuration of a b-th scan line SL(b) to be described below.

The fifth conductive layer M5 is disposed on the first planarization layer 116. The fifth conductive layer M5 is an intermediate layer for connecting the fourth conductive layer M4. The fifth conductive layer M5 can be configured by a conductive material, such as copper (Cu), aluminum (Al), molybdenum (Mo), nickel (Ni), titanium (Ti), chrome (Cr), or an alloy thereof, but is not limited thereto.

The second planarization layer 117 is disposed on the fifth conductive layer M5.

Figure 8:
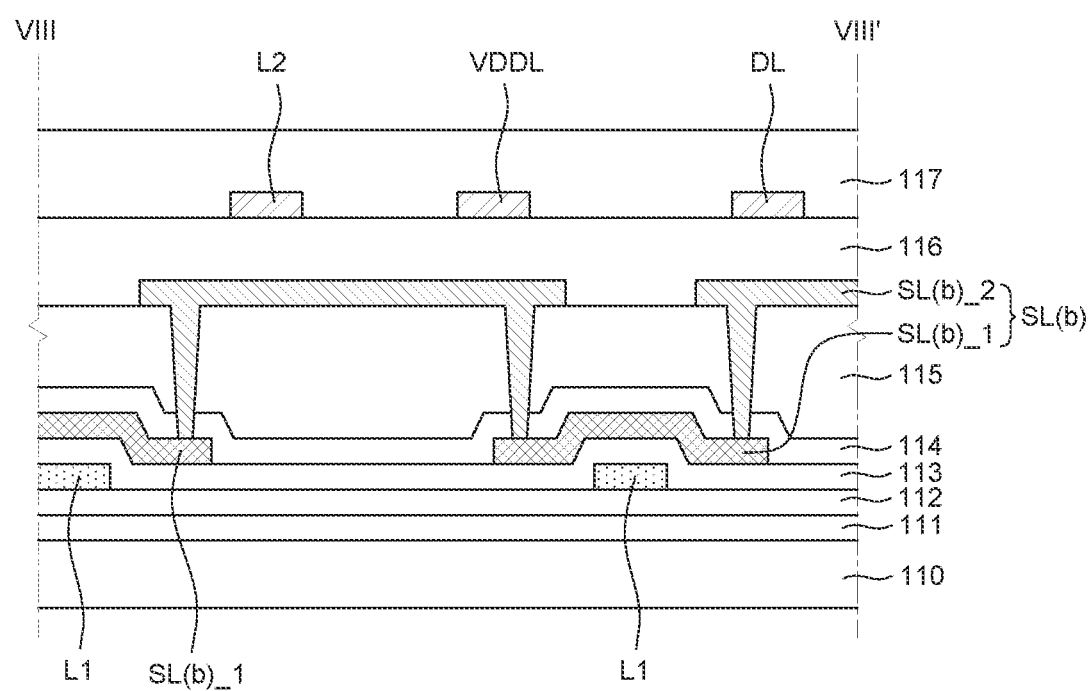
FIG. 8 is a cross-sectional view taken along the line VIII-VIII' of FIG. 6.

FIG. 8 illustrates a cross-section of an area where the n-th scan line SL(n) extending in a horizontal direction on the plan view of the pixel circuit illustrated in FIG. 6 is disposed. In FIG. 6, for the purpose of general description, the n-th scan line SL(n) and the n−1-th scan line SL(n−1) are illustrated. However, in FIG. 8, for the purpose of explanation of a specific second sub pixel SP2, for example, the second sub pixel SP2 located on a b-th line, the n-th scan line SL(n) is denoted as a b-th scan line SL(b).

Referring to FIG. 8, the first buffer layer 111 is disposed on the substrate 110 and the second buffer layer 112 is disposed on the first buffer layer 111.

The first wiring line L1 is disposed on the second buffer layer 112. The first wiring line L1 can be formed of the same material as the active layer ACT. Further, the first wiring line L1 can be connected to the active layer ACT. However, a current may not flow in the first wiring line L1 except for an area serving as an active layer.

The gate insulating layer 113 is disposed on the first wiring line L1.

In the foldable display device 100 according to the exemplary embodiment of the present disclosure, the b-th scan line SL(b) of the second sub pixel SP2 disposed in the folding area FA includes a first part SL(b)_1 and a second part SL(b)_2. The first part SL(b)_1 and the second part SL(b)_2 of the b-th scan line SL(b) are disposed on different layers.

The first part SL(b)_1 of the b-th scan line SL(b) is disposed on the gate insulating layer 113. The first part SL(b)_1 of the b-th scan line SL(b) can be formed of the same material as the gate electrode GE. Specifically, the first part SL(b)_1 of the b-th scan line SL(b) can be formed integrally with the gate electrode GE of the third transistor T3. The first part SL(b)_1 of the b-th scan line SL(b) can be configured by a conductive material, such as copper (Cu), aluminum (Al), molybdenum (Mo), nickel (Ni), titanium (Ti), chrome (Cr), or an alloy thereof and can be configured by molybdenum (Mo) in accordance with the configuration of the second part SL(b)_2.

The first interlayer insulating layer 114 is disposed on the first part SL(b)_1 of the b-th scan line SL(b) and the second interlayer insulating layer 115 is disposed on the first interlayer insulating layer 114.

The second part SL(b)_2 of the b-th scan line SL(b) is disposed on the second interlayer insulating layer 115. The second part SL(b)_2 of the b-th scan line SL(b) can be formed of the same material as the source electrode and the drain electrode. The second part SL(b)_2 of the b-th scan line SL(b) can be configured by a conductive material such as copper (Cu), aluminum (Al), molybdenum (Mo), nickel (Ni), titanium (Ti), chrome (Cr), or an alloy thereof, but is not limited thereto.

In the meantime, the second part SL(b)_2 of the b-th scan line SL(b) can be formed of a material having a modulus and a fracture strain higher than those of a material which configures first part SL(b)_1 of the b-th scan line SL(b). For example, when the first part SL(b)_1 of the b-th scan line SL(b) is formed of molybdenum (Mo), the second part SL(b)_2 of the b-th scan line SL(b) can be formed of aluminum (Al).

The second part SL(b)_2 of the b-th scan line SL(b) is connected to the first part SL(b)_1 of the b-th scan line SL(b) by means of a contact hole formed in the first interlayer insulating layer 114 and the second interlayer insulating layer 115. The b-th scan line SL(b) formed in the folding area is configured by the first part SL(b)_1 and the second part SL(b)_2 disposed on different layers and the first part SL(b)_1 and the second part SL(b)_2 of the b-th scan line SL(b) are electrically connected by means of the contact hole to form one scan line.

The first planarization layer 116 is disposed on the second part SL(b)_2 of the b-th scan line SL(b). The second wiring line L2, the high potential power line VDDL, and the data line DL are disposed on the first planarization layer 116. The second planarization layer 117 is disposed on the second wiring line L2, the high potential power line VDDL, and the data line DL.

Generally, the scan line is formed of the same material as the gate electrode GE and mainly uses molybdenum Mo. However, molybdenum (Mo) has a low modulus and a low fracture strain so that when the folding or the bending is generated, molybdenum can be easily cracked and cause a defect. Accordingly, when the scan line disposed in the folding area is formed of molybdenum (Mo) like the scan line disposed in the non-folding area, the scan line is cracked due to the repeated folding of the display device. Consequently, a minute load difference is generated due to the defect of the scan signal. This causes a dim type failure, which results in the deterioration of the quality of the display panel.

In the foldable display device 100 according to the exemplary embodiment of the present disclosure, the b-th scan line SL(b) of the second sub pixel SP2 disposed in the folding area FA includes a first part SL(b)_1 and a second part SL(b)_2 which are disposed on different layers. Specifically, the first part SL(b)_1 of the b-th scan line SL(b) is disposed on the gate insulating layer 113 and is formed of the same material as the gate electrode GE. Further, the second part SL(b)_2 of the b-th scan line SL(b) is disposed on the second interlayer insulating layer 115 and is formed of the same material as the source electrode SE and the drain electrode DE. For example, the first part SL(b)_1 of the b-th scan line SL(b) is formed of molybdenum (Mo) and the second part SL(b)_2 of the b-th scan line SL(b) is formed of aluminum (Al). Some metal line which configures the scan line is configured by aluminum (Al), rather than molybdenum (Mo) which has been used in the related art so that the durability and the foldability of the scan line can be improved.

Further, a specific resistance of aluminum (Al) is lower than a specific resistance of molybdenum (Mo). For example, a specific resistance of aluminum (Al) is approximately $4.6 \times 10^{-2}$ $\Omega \cdot \mu m$ and a specific resistance of molybdenum (Mo) is approximately $1.5 \times 10^{-1}$ $\Omega \cdot \mu m$. Accordingly, as described in the present disclosure, when the scan line is formed with the first part SL (b)_1 configured with molybdenum (Mo) and the second part SL(b)_2 configured with aluminum (Al), a load applied to the wiring line can be reduced as compared with the scan line which is only formed with molybdenum (Mo). Further, the signal can be more quickly transmitted. Accordingly, the durability and the performance of the display panel PNL can be improved.

In FIGS. 7 and 8, in the foldable display device 100 according to the exemplary embodiment of the present disclosure, the emission control signal line ECL of the second sub pixel SP2 disposed in the folding area FA can include a third part and a fourth part disposed on different layers, like the b-th scan line SL(b). For example, the emission control signal line ECL disposed in the folding area FA includes the third part disposed on the gate insulating layer 113 and the fourth part disposed on the second interlayer insulating layer 115. Further, the fourth part of the emission control signal line ECL is connected to the third part of the emission control signal line ECL by means of a contact hole formed in the first interlayer insulating layer 114 and the second interlayer insulating layer 115.

Further, the third part of the emission control signal line ECL is formed of molybdenum (Mo) and the fourth part of the emission control signal line ECL is formed of aluminum (Al). One part of the emission control signal line ECL is formed of aluminum (Al) so that as compared with the single layered emission control signal line ECL only formed of molybdenum (Mo), the durability and the foldability can be improved.

In the foldable display device according to the exemplary embodiment of the present disclosure, the scan lines and/or the emission control signal lines disposed in the folding area and the non-folding area have different configurations. Specifically, the scan lines and/or the emission control signal lines disposed in the non-folding area is formed as a single layer on the gate insulating layer. In contrast, the scan lines and/or the emission control signal lines disposed in the folding area is formed by a first part and a second part disposed on different layers and any one of the first part and the second part is configured with a material having a more excellent modulus and fracture strain than those of the material which configures the scan line and/or the emission control signal line disposed in the non-folding area. By doing this, the durability and the foldability of the wiring line can be improved. Therefore, when the display device is folded or bent, a crack of the scan line and/or the emission control signal line can be suppressed and the durability and the display quality of the display panel can be improved.

The exemplary embodiments of the present disclosure can also be described as follows:

According to an aspect of the present disclosure, there is provided a foldable display device. The foldable display device comprises a flexible display substrate including a folding area and non-folding areas on both sides of the folding area, and a plurality of scan lines which are disposed on the flexible substrate and extends in a first direction. The scan lines disposed in the folding area include a first part and a second part which are disposed on different layers and which are formed of different materials.

Any one of the first part and the second part can be formed of molybdenum and the other one of the first part and the second part is formed of aluminum.

The scan lines disposed in the non-folding area can be formed as a single layer, the first part can be disposed on the same layer as the single layer and the second part can be formed of a material having a modulus and a fracture strain higher than those of the first part.

The scan line disposed in the non-folding area can be a single layer formed of molybdenum.

The foldable display device can further comprise a plurality of emission control signal lines which are disposed on the flexible substrate and extends in the first direction. The emission control signal lines disposed in the folding area can include a third part and a fourth part which are disposed on different layers and are formed of different materials.

The third part can be disposed on the same layer as the first part and the fourth part is disposed on the same layer as the second part.

The foldable display device can further comprise a gate insulating layer on the flexible substrate, a gate electrode disposed on the gate insulating layer, a first interlayer insulating layer on the gate electrode, a second interlayer insulating layer on the first interlayer insulating layer, a source electrode and a drain electrode on the second interlayer insulating layer, and a planarization layer on the source electrode and the drain electrode. The first part can be disposed on the gate insulating layer, the second part can be disposed on the second interlayer insulating layer, and the first part and the second part can be connected by means of a contact hole formed in the first interlayer insulating layer and the second interlayer insulating layer.

The scan line in the non-folding area can be disposed on the gate insulating layer as a single layer.

The foldable display device can further comprise a plurality of data lines and a plurality of high potential power lines extending in a second direction perpendicular to the first direction. The second part can be formed of the same material as the plurality of data lines and the plurality of high potential power lines.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device, comprising:
   a flexible display substrate including a folding area and non-folding areas on sides of the folding area; and
   a plurality of scan lines which is disposed on the flexible display substrate and extends in a first direction,
   wherein the scan lines disposed in the folding area include a first part and a second part which are disposed on different layers, and
   the first and second parts of the scan lines disposed in the folding area are formed of different materials.

2. The foldable display device according to claim 1, wherein one among the first part and the second part of the scan lines disposed in the folding area is formed of molybdenum, and the other one among the first part and the second part of the scan lines disposed in the folding area is formed of aluminum.

3. The foldable display device according to claim 1, wherein the scan lines disposed in at least one of the non-folding areas are formed as a single layer,
   the first part is disposed on a same layer as the single layer, and
   the second part is formed of a material having a modulus and a fracture strain higher than those of the first part.

4. The foldable display device according to claim 3, wherein one of the scan lines disposed in the at least one non-folding area is a single layer formed of molybdenum.

5. The foldable display device according to claim 1, further comprising:
   a plurality of emission control signal lines which are disposed on the flexible substrate and extends in the first direction,
   wherein the emission control signal lines disposed in the folding area include a third part and a fourth part which are disposed on different layers and which are formed of different materials.

6. The foldable display device according to claim 5, wherein the third part is disposed on a same layer as the first part, and
   the fourth part is disposed on a same layer as the second part.

7. The foldable display device according to claim 1, further comprising:
   a gate insulating layer disposed on the flexible substrate;
   a gate electrode disposed on the gate insulating layer;
   a first interlayer insulating layer disposed on the gate electrode;
   a second interlayer insulating layer disposed on the first interlayer insulating layer;
   a source electrode and a drain electrode disposed on the second interlayer insulating layer; and
   a planarization layer disposed on the source electrode and the drain electrode,
   wherein the first part is disposed on the gate insulating layer, the second part is disposed on the second interlayer insulating layer, and
   the first part and the second part are connected through a contact hole formed in the first interlayer insulating layer and the second interlayer insulating layer.

8. The foldable display device according to claim 7, wherein one of the scan lines in at least one of the non-folding areas is disposed on the gate insulating layer as a single layer.

9. The foldable display device according to claim 1, further comprising:
   a plurality of data lines and a plurality of high potential power lines extending in a second direction substantially perpendicular to the first direction,
   wherein the second part of the scan lines disposed in the folding area is formed of a same material as the plurality of data lines and the plurality of high potential power lines.

* * * * *